US009793237B2

(12) United States Patent
Railkar et al.

(10) Patent No.: US 9,793,237 B2
(45) Date of Patent: Oct. 17, 2017

(54) HOLLOW-CAVITY FLIP-CHIP PACKAGE WITH REINFORCED INTERCONNECTS AND PROCESS FOR MAKING THE SAME

(71) Applicant: TriQuint Semiconductor, Inc., Hillsboro, OR (US)

(72) Inventors: Tarak A. Railkar, Plano, TX (US); Kevin J. Anderson, Plano, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/085,458

(22) Filed: Mar. 30, 2016

(65) Prior Publication Data

US 2017/0110434 A1    Apr. 20, 2017

Related U.S. Application Data

(60) Provisional application No. 62/243,252, filed on Oct. 19, 2015.

(51) Int. Cl.
*H01L 23/00* (2006.01)
(52) U.S. Cl.
CPC .............. *H01L 24/81* (2013.01); *H01L 24/09* (2013.01); *H01L 24/17* (2013.01); *H01L 2224/0901* (2013.01); *H01L 2224/0912* (2013.01); *H01L 2224/1705* (2013.01); *H01L 2224/17106* (2013.01); *H01L 2224/812* (2013.01); *H01L 2224/81375* (2013.01); *H01L 2224/81385* (2013.01); *H01L 2224/81815* (2013.01)
(58) Field of Classification Search
CPC ...... H01L 51/5246; H01L 21/77; H01L 24/81
See application file for complete search history.

(56) References Cited

U.S. PATENT DOCUMENTS

| | | | |
|---|---|---|---|
| 5,159,433 A | 10/1992 | Kazami et al. | |
| 5,274,913 A * | 1/1994 | Grebe | H01L 21/563 228/119 |
| 6,476,463 B1 | 11/2002 | Kaneko et al. | |
| 7,166,910 B2 | 1/2007 | Minervini | |
| 7,187,073 B2 | 3/2007 | Shoji | |
| 8,018,049 B2 | 9/2011 | Minervini | |

(Continued)

OTHER PUBLICATIONS

Norris, K. C. et al., "Reliability of Controlled Collapse Interconnections," IBM Journal of Research and Development, vol. 13, No. 3, May 1969, pp. 266-271.

(Continued)

*Primary Examiner* — Marc Armand
(74) *Attorney, Agent, or Firm* — Withrow & Terranova, P.L.L.C.

(57) ABSTRACT

The present disclosure relates to a flip-chip package with a hollow-cavity and reinforced interconnects, and a process for making the same. The disclosed flip-chip package includes a substrate, a reinforcement layer over an upper surface of the substrate, a flip-chip die attached to the upper surface of the substrate by interconnects through the reinforcement layer, an air cavity formed between the substrate and the flip-chip die, and a protective layer encapsulating the flip-chip die and defining a perimeter of the air cavity. Herein, a first portion of each interconnect is encapsulated by the reinforcement layer and a second portion of each interconnect is exposed to the air cavity. The reinforcement layer provides reinforcement to each interconnect.

16 Claims, 7 Drawing Sheets

(56) References Cited

U.S. PATENT DOCUMENTS

| | | | |
|---|---|---|---|
| 8,742,570 | B2 | 6/2014 | Shenoy et al. |
| 8,836,111 | B2 | 9/2014 | Conti et al. |
| 8,853,564 | B2 | 10/2014 | Lo et al. |
| 9,293,422 | B1 | 3/2016 | Parsa et al. |
| 2002/0036227 | A1* | 3/2002 | Milewski ............... B23K 31/02 228/246 |
| 2005/0285131 | A1 | 12/2005 | Gallup et al. |
| 2007/0108634 | A1 | 5/2007 | Higashi et al. |
| 2010/0072564 | A1 | 3/2010 | Saitoh et al. |
| 2014/0145315 | A1* | 5/2014 | Lim ..................... H01L 23/552 257/659 |

OTHER PUBLICATIONS

Zhao, Renzhe et al., "Processing of Fluxing Underfills for Flip Chip-on-Laminate Assembly," IEEE Transactions on Electronics Packaging Manufacturing, vol. 26, No. 1, Jan. 2003, 18 pages.

Author Unknown, "Package-in Package (PiP)," STATS ChipPAC Ltd., 2015, 2 pages, http://www.statschippac.com/packaging/packaging/wirebond/laminate/pip.aspx.

Author Unknown, "Package on package," Wikipedia, The Free Encylopedia, last modified: Dec. 25, 2015, 4 pages, https://en.wikipedia.org/wiki/Package_on_package.

Non-Final Office Action for U.S. Appl. No. 15/292,464, dated Apr. 14, 2017, 9 pages.

Notice of Allowance and Examiner-Initiated Interview Summary for U.S. Appl. No. 15/292,464, dated Jun. 21, 2017, 9 pages.

\* cited by examiner

HOLLOW-CAVITY FLIP-CHIP PACKAGE WITH REINFORCED INTERCONNECTS AND PROCESS FOR MAKING THE SAME

RELATED APPLICATIONS

This application claims the benefit of U.S. provisional patent application No. 62/243,252, filed Oct. 19, 2015, the disclosure of which is incorporated herein by reference in its entirety.

FIELD OF THE DISCLOSURE

The present disclosure relates to a flip-chip package and a process for making the same, and more particularly to a flip-chip package with a hollow-cavity and reinforced interconnects, and a process to form a hollow-cavity within the flip-chip package and to reinforce interconnects of the flip-chip package.

BACKGROUND

Flip-chip assembly technology is widely utilized in semiconductor packaging due to its short interconnect paths between flip-chip dice and a substrate, which eliminates the space needed for wire bonding and thus reduces the overall size of the package. In addition, the elimination of wire bonds reduces undesired parasitic inductance, thereby making this package configuration attractive for high-frequency applications.

For microelectronic components, Coefficient of Thermal Expansion (CTE) mismatch between the die and the substrate is a major contributor of reliability concerns. In flip-chip assembly, the CTE mismatch between the flip-chip die and a laminate substrate can typically be large, which results in cracks in the solder joint—a major reliability concern. The CTE mismatch between the flip-chip die and a ceramic substrate is relatively small, but the ceramic substrate is expensive compared to most laminate substrates. To address this issue, mold compounds or capillary underfill formulations are widely used to underfill the flip-chip die. By underfilling the flip-chip die, the mold compounds or capillary underfill formulations completely fill the entire space between the flip-chip die and the substrate and fully encapsulate the solder joints. These mold compounds or capillary underfill formulations provide mechanical support to the solder joints.

However, presence of the underfill materials between the flip-chip die and the substrate adversely impacts the electrical performance of the flip-chip assemblies, especially for high-frequency flip-chip die.

Accordingly, there remains a need for improved package designs to reinforce solder joints in flip-chip assembly without degrading the electronic performance of the flip-chip dice. In addition, there is also a need to protect the flip-chip dice against damage from the outside environment without significantly increasing the package size.

SUMMARY

The present disclosure relates to a flip-chip package with a hollow-cavity and reinforced interconnects, and a process for making the same. The disclosed flip-chip package includes a substrate, a reinforcement layer over an upper surface of the substrate, a flip-chip die connected to the upper surface of the substrate by interconnects through the reinforcement layer, an air cavity formed between the substrate and the flip-chip die, and a protective layer encapsulating the flip-chip die and defining a perimeter of the air cavity. Herein, a first portion of each interconnect is encapsulated by the reinforcement layer and a second portion of each interconnect is exposed to the air cavity. The reinforcement layer provides reinforcement to each interconnect.

According to an exemplary process, a reinforcement material is applied over an upper surface of a substrate. A flip-chip die is then placed onto the upper surface of the substrate such that each interconnect of the flip-chip die is in contact with a corresponding substrate input/output (I/O) pad through the reinforcement material. Next, a solder cap of each interconnect is reflowed within the reinforcement material to form a solder joint mechanically and electronically connected the corresponding substrate I/O pad and the reinforcement material is cured to form a reinforcement layer. An air cavity is consequently formed between the substrate and the flip-chip die. A first portion of each interconnect is encapsulated by the reinforcement layer and a second portion of each interconnect is exposed to the air cavity. Finally, a protective layer is formed to encapsulate the flip-chip die and to define a perimeter of the air cavity.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1A:
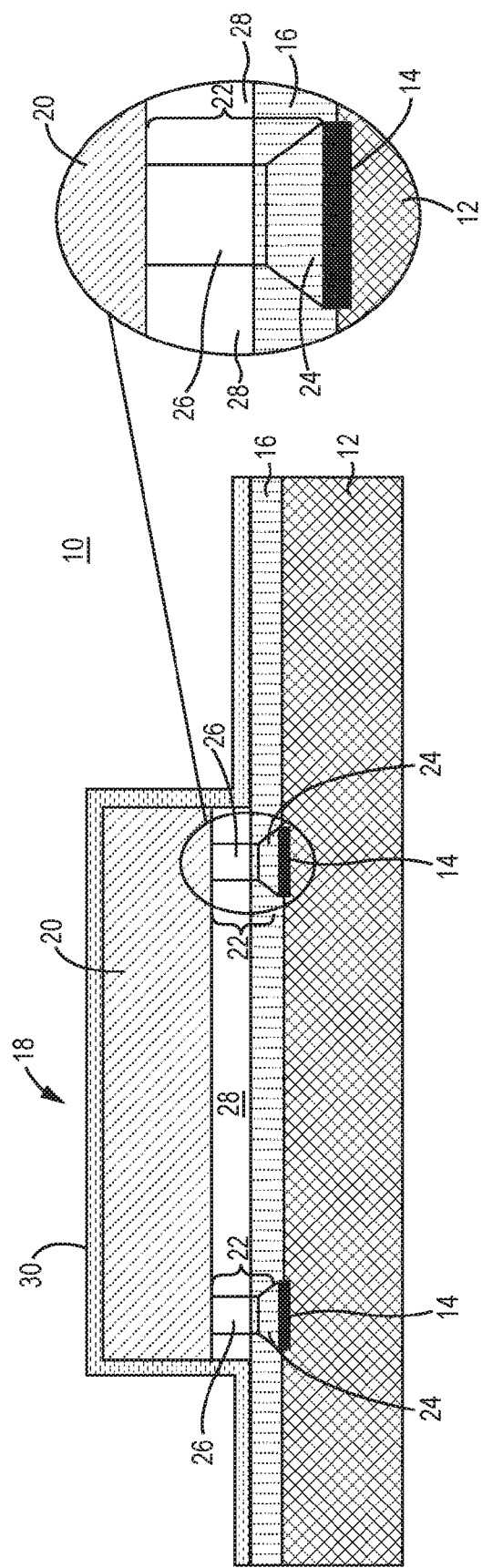
FIGS. 1A-1C show an exemplary flip-chip package with a hollow-cavity and reinforced interconnects according to one embodiment of the present disclosure.

The embodiments set forth below represent the necessary information to enable those skilled in the art to practice the disclosure and illustrate the best mode of practicing the embodiments. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A shows an exemplary flip-chip package 10 according to one embodiment of the present disclosure. In this embodiment, the flip-chip package 10 includes a substrate 12 having an upper surface with a number of substrate input/output (I/O) pads 14 and a reinforcement layer 16 over the upper surface of the substrate 12. The substrate 12 may be formed of laminate, ceramic, or other chip carrier materials. A thickness of the substrate 12 is generally between 0.2 mm and 0.75 mm. The reinforcement layer 16 may be formed of Yincae SMT256, Senju EF100, Senju JPK9S or other similar formulations. A thickness of the reinforcement layer 16 is typically between 5 µm and 50 µm.

The flip-chip package 10 also includes a flip-chip die 18. For the purpose of this illustration, there is only one flip-chip die 18 included in the flip-chip package 10. In different applications, the flip-chip package 10 may include multiple flip-chip dice. The flip-chip die 18 has a die body 20 and a number of interconnects 22 extending outward from a bottom surface of the die body 20. Each interconnect 22 is connected to a corresponding one of substrate I/O pads 14 through the reinforcement layer 16. A height of each interconnect 22 is the same, between 20 µm and 125 µm.

In detail, each interconnect 22 includes a solder joint 24 and a pillar 26 extending outward from the bottom surface of the die body 20 to the solder joint 24. The solder joint 24 is connected to the corresponding one of substrate I/O pads 14 within the reinforcement layer 16. The solder joint 24 may be formed of tin, tin-silver, or tin-silver-copper and the pillar 26 may be formed of copper. A height of the solder joint 24 is between 5 µm and 25 µm and a height of the pillar 26 is between 10 µm and 100 µm. Herein, the solder joint 24 and a first portion of the pillar 26 of each interconnect 22 are encapsulated by at least one portion of the reinforcement layer 16. The first portion of the pillar 26 encapsulated by the reinforcement layer 16 has a thickness of no more than 15 µm. The reinforcement layer 16 provides superior reinforcement to each interconnect 22 and resists the solder joint 24 from cracking due to stresses from CTE mismatch.

An air cavity 28 formed between the bottom surface of the die body 20 and the upper surface of the substrate 12 is also included in the flip-chip package 10. A second portion of the pillar 26 of each interconnect 22 is exposed to the air cavity 28. The exposed second portion of the pillar 26 is typically 60%-80% of each interconnect 22, but other ratios are possible. Non-encapsulation of a major portion of each interconnect 22 is typically beneficial for electronic performance of the flip-chip die 18, especially for high-frequency performance. Because the reinforcement layer 16 encapsulates a minor portion of each interconnect 22, the reinforcement layer 16 has low impact to electrical signals propagating from the flip-chip die 18 to the substrate 12 and vice-versa.

In addition, the flip-chip package 10 further includes a protective layer 30. The protective layer 30 extends over a top surface of the die body 20, down side surfaces of the die body 20, and toward the upper surface of the substrate 12 to define a perimeter of the air cavity 28. In this flip-chip package 10, the at least one portion of the reinforcement layer 16, which encapsulates the solder joint 24 and a first portion of the pillar 26 of each interconnect 22, is a contiguous section and extends along the upper surface of the substrate 12 and outside of the perimeter of the air cavity 28. Herein, the protective layer 30 extends to the reinforcement layer 16 and covers a portion of the reinforcement layer 16 to encapsulate the flip-chip die 18. The protective layer 30 may be formed of epoxy, resin, or epoxy resin, with a thickness typically between 25 µm and 500 µm. The protective layer 30 protects the flip-chip die 18 against damage from the outside environment without significantly increasing the size of the flip-chip package 10.

Figure 1B:
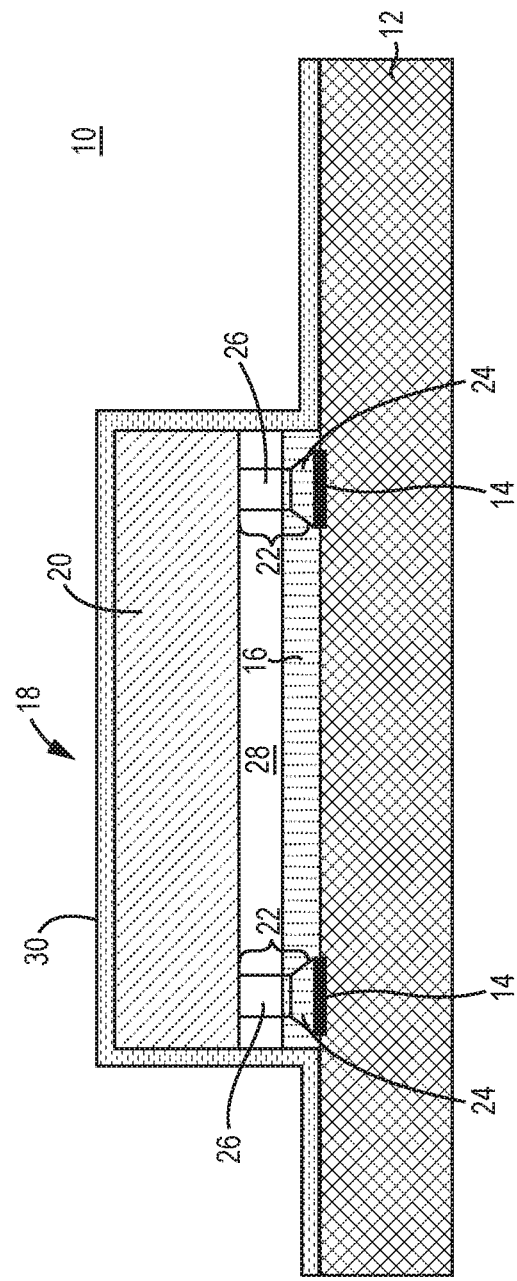

It will be obvious to those skilled in the art that it is also possible that the at least one portion of the reinforcement layer 16, which encapsulates the solder joint 24 and a first portion of the pillar 26 of each interconnect 22, is a contiguous section and does not extend outside of an area on the upper surface of the substrate 12 that is underneath the die body 20. The protective layer 30 extends directly to the upper surface of the substrate 12 and covers a portion of the upper surface of the substrate 12 to encapsulate the flip-chip die 18, as shown in FIG. 1B.

Figure 1C:
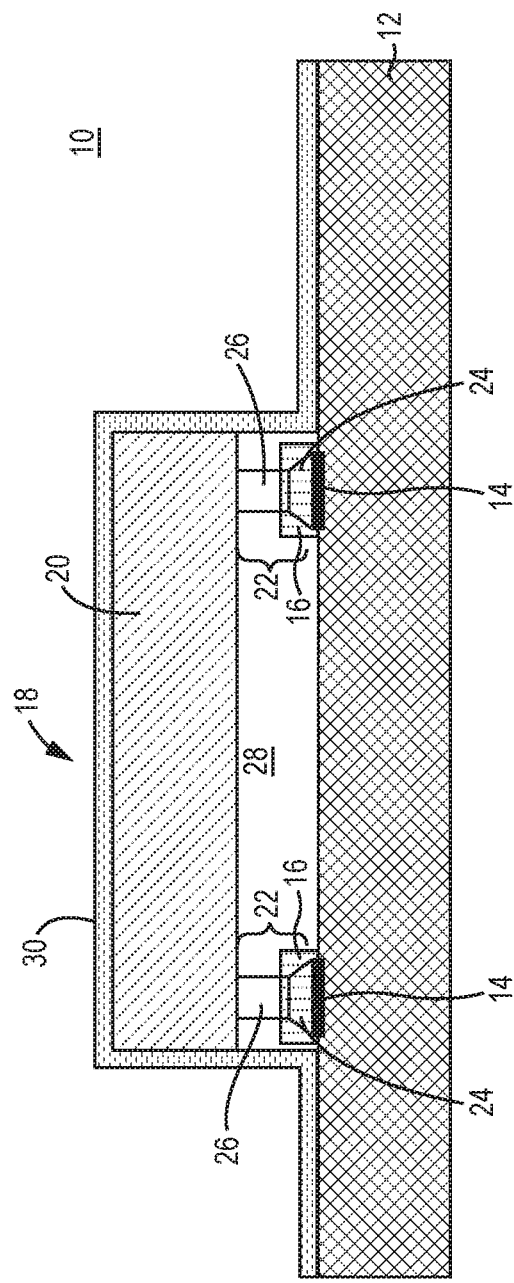

In another embodiment, as shown in FIG. 1C, the at least one portion of the reinforcement layer 16, which encapsulates the solder joint 24 and a first portion of the pillar 26 of each interconnect 22, includes a number of separate sections. Each separate section of the reinforcement layer 16 encapsulates a corresponding solder joint 24 and a corresponding first portion of the pillar 26 of each interconnect 22. None of the separate sections of the reinforcement layer 16 extends outside of the perimeter of the air cavity 28. The protective layer 30 extends directly to the upper surface of the substrate 12 and covers a portion of the upper surface of the substrate 12.

FIGS. 2A-2E illustrate an exemplary process to form the exemplary flip-chip package 10 shown in FIG. 1A. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 2A-2E.

Figure 2A:
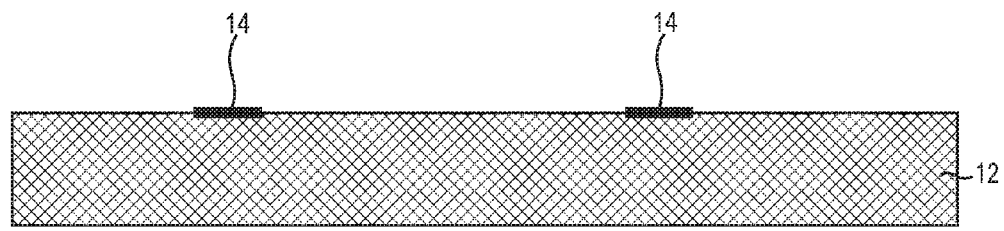
FIGS. 2A-2E show an exemplary process of forming the exemplary flip-chip package shown in FIG. 1A.
Figure 2B:
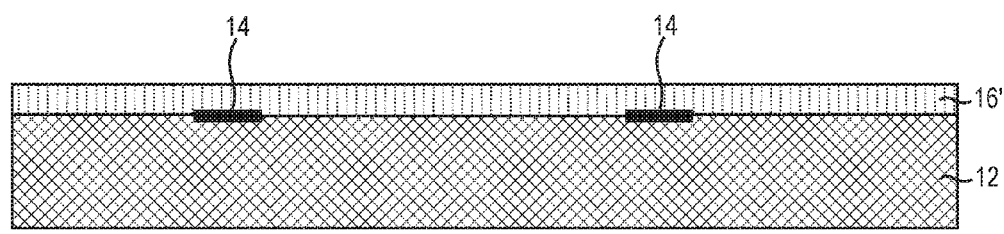

Initially, a substrate 12 having an upper surface with a number of substrate I/O pads 14 is provided as depicted in FIG. 2A. Then, a reinforcement material 16' is applied to the upper surface of the substrate 12 as depicted in FIG. 2B. Applying the reinforcement material 16' over the upper surface of the substrate 12 may be provided by stencil printing, controlled spraying, pin-transfer or other suitable means. By stencil printing, the reinforcement material 16' may be applied to specific upper surface areas of the substrate 12 but not the entire upper surface of the substrate 12 (not shown).

Figure 2C:
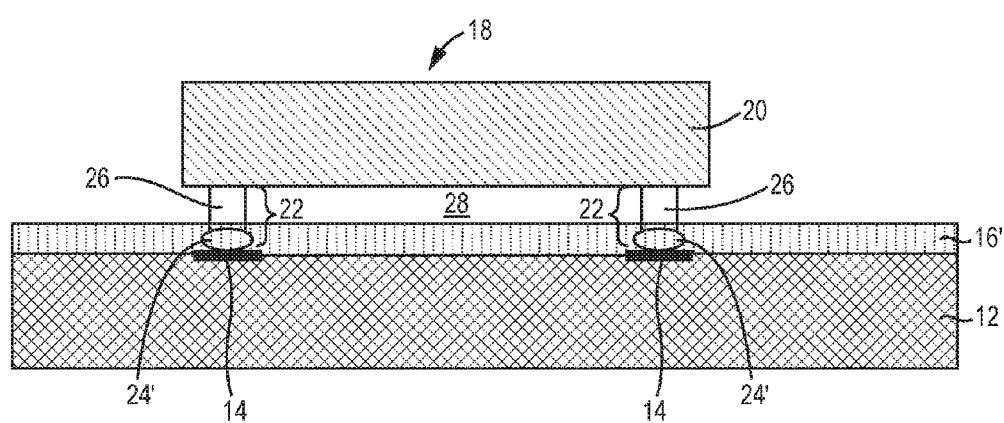
Figure 2D:
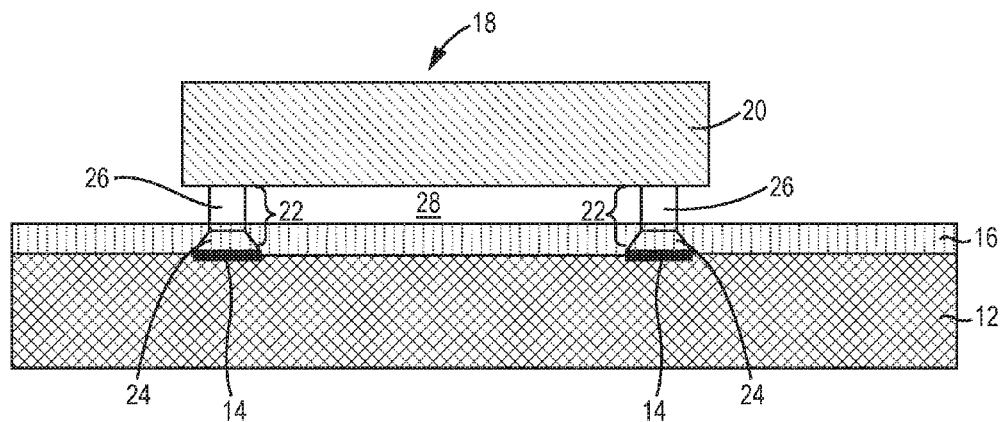
Figure 2E:
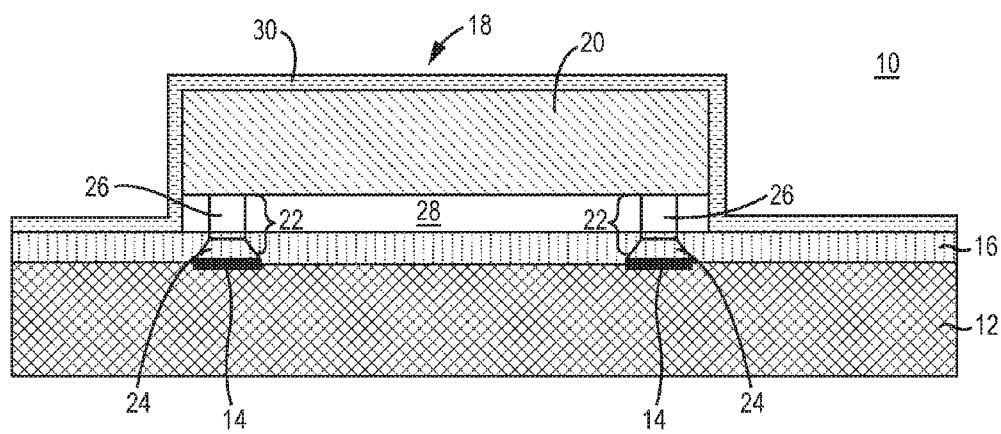

Next, a flip-chip die 18 is attached to the substrate 12 as depicted in FIGS. 2C-2E. For the purpose of this illustration, there is only one flip-chip die 18 attached to the substrate 12. In different applications, multiple flip-chip dice may be attached to the substrate 12. The flip-chip die 18 has a die body 20 and a number of interconnects 22 extending outward from a bottom surface of the die body 20. Herein, each interconnect 22 includes a solder cap 24' and a pillar 26 extending outward from the bottom surface of the die body 20 to the solder cap 24'.

In detail, the attaching process between the flip-chip die 18 and the substrate 12 begins with placing the solder cap 24' of each interconnect 22 in contact with a corresponding one of the substrate I/O pads 14 through the reinforcement material 16' as depicted in FIG. 2C. The reinforcement material 16' encapsulates the solder cap 24' and a first portion of the pillar 26 of each interconnect 22. An air cavity 28 is consequently formed between the bottom surface of the die body 20 and the upper surface of the substrate 12. A second portion of the pillar 26 of each interconnect 22 is exposed to the air cavity 28.

Then, reflowing the solder cap 24' of each interconnect 22 within the reinforcement material 16' is followed as depicted in FIG. 2D. During the reflowing process, the solder cap 24' of each interconnect 22 is reflowing to form a solder joint 24, which is mechanically and electronically connected to the corresponding one of substrate I/O pads 14. Herein, the reinforcement material 16' provides a clean surface for the reflowing process. The reflowing process may be provided by heating in a furnace. In the meantime, the reinforcement material 16' may be cured to form a reinforcement layer 16 by the same heating step. At least one portion of the reinforcement layer 16 encapsulates the solder joint 24 and a first portion of the pillar 26 of each interconnect 22. In some applications, the reflowing process and curing process may be accomplished separately. The cured reinforcement layer 16 provides superior reinforcement to each interconnect 22 and prevents the solder joint 24 from cracking due to stresses from CTE mismatch.

Finally, a protective layer 30 is formed over a top surface of the die body 20, down side surfaces of the die body 20, and toward the upper surface of the substrate 12 to define a perimeter of the air cavity 28 as depicted in FIG. 2E. The protective layer 30 may be formed by sheet molding. In this exemplary process, the at least one portion of the reinforcement layer 16, which encapsulates the solder joint 24 and a first portion of the pillar 26 of each interconnect 22, is a contiguous section and extends along the upper surface of the substrate 12 outside of the perimeter of the air cavity 28. The protective layer 30 extends to the reinforcement layer 16 and covers a portion of the reinforcement layer 16 to encapsulate the flip-chip die 18. In some applications, the at least one portion of the reinforcement layer 16, which encapsulates the solder joint 24 and a first portion of the pillar 26 of each interconnect 22, is a contiguous section and does not extend outside of an area on the upper surface of the substrate 12 that is underneath the die body 20. And, the protective layer 30 extends directly to the upper surface of the substrate 12 and covers a portion of the upper surface of the substrate 12 to encapsulate the flip-chip die 18 (not shown).

FIGS. 3A-3E illustrate an exemplary process to form the exemplary flip-chip package 10 shown in FIG. 1C. Although the exemplary process is illustrated as a series of sequential steps, the exemplary process is not necessarily order dependent. Some operations may be done in a different order than that presented. Further, processes within the scope of this disclosure may include fewer or more operations than those illustrated in FIGS. 3A-3E.

Figure 3A:
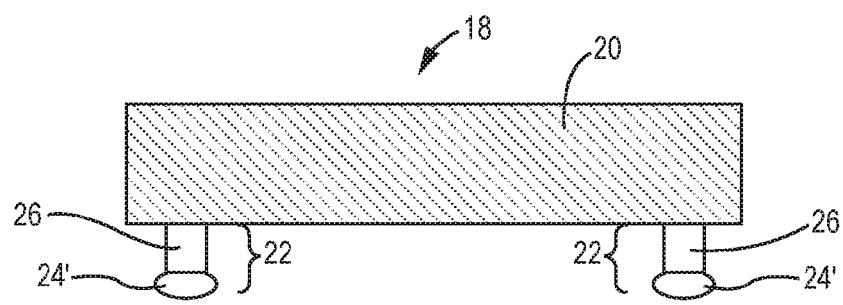
FIGS. 3A-3E show an exemplary process of forming the exemplary flip-chip package shown in FIG. 1C.

Initially, a flip-chip die 18 having a die body 20 and a number of interconnects 22 extending outward from a bottom surface of the die body 20 is provided as depicted in FIG. 3A. Each interconnect 22 includes a solder cap 24' and a pillar 26 extending outward from the bottom surface of the die body 20 to the solder cap 24'. For the purpose of this illustration, there is only one flip-chip die 18 provided. In different applications, multiple flip-chip dice may be used in a flip-chip package.

Figure 3B:
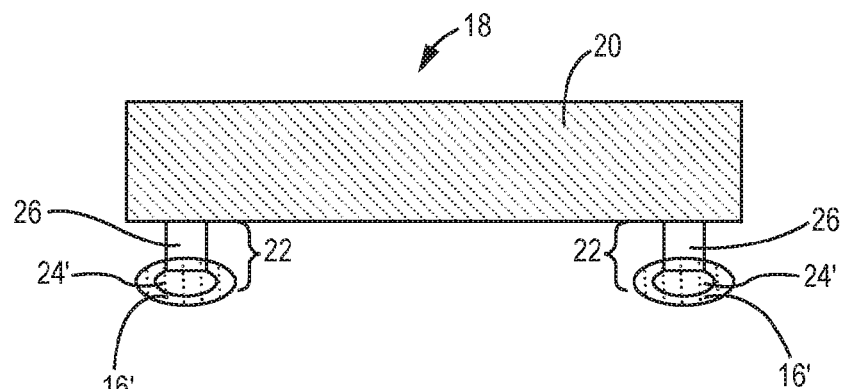

Next, a reinforcement material 16' is applied to each interconnect 22 as depicted in FIG. 3B. The reinforcement material 16' encapsulates the solder cap 24' and a first portion of the pillar 26 of each interconnect 22. Applying the reinforcement material 16' to each interconnect 22 may be provided by dipping each end of the plurality of interconnects in a reinforcement material tray or a pick-dip-and-place method.

Figure 3C:
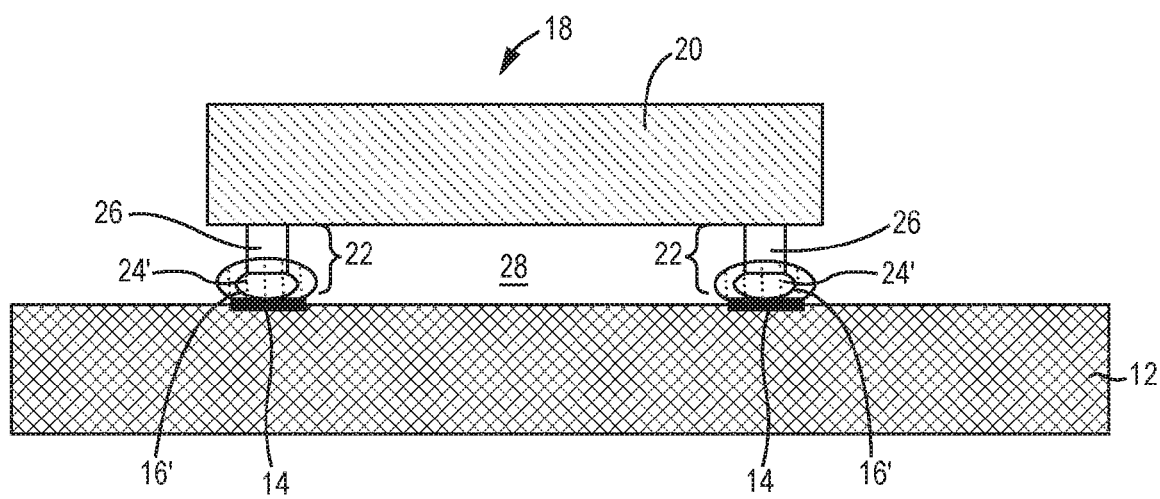

The flip-chip die 18 is then placed onto an upper surface of a substrate 12 as depicted in FIG. 3C. The substrate 12 has an upper surface with a number of substrate I/O pads 14. The solder cap 24' of each interconnect 22 is coupled to a corresponding one of the substrate I/O pads 14. The reinforcement material 16' is in contact with each substrate I/O pad 14. An air cavity 28 is consequently formed between the bottom surface of the die body and the upper surface of the substrate. A second portion of the pillar 26 of each interconnect 22 is exposed to the air cavity 28.

Figure 3D:
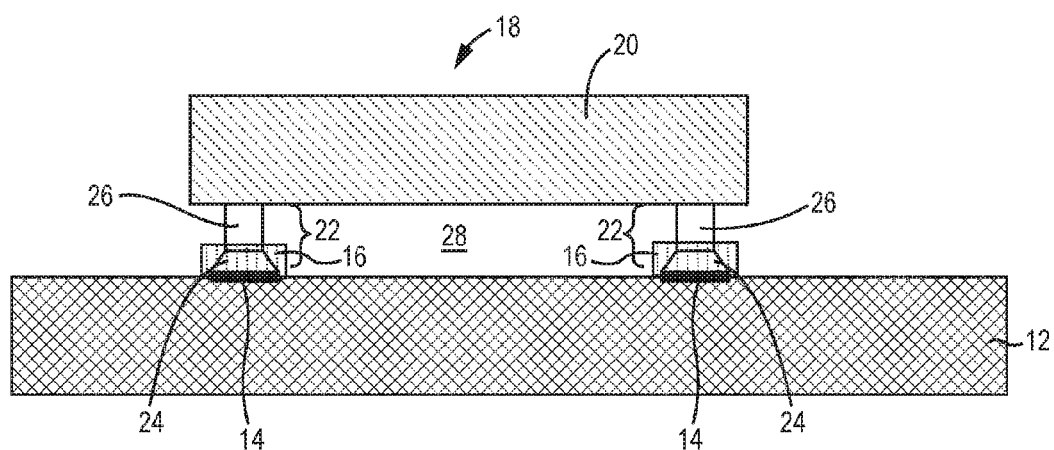

Then, reflowing the solder cap 24' of each interconnect 22 is followed as depicted in FIG. 3D. During the reflowing process, the solder cap 24' of each interconnect 22 is reflowing to form a solder joint 24, which is connected to the corresponding one of the substrate I/O pads 14. The reflowing process may be provided by heating in a furnace. In the meantime, the reinforcement material 16' may be cured to form a reinforcement layer 16 by the same heating step. In some applications, the reflowing process and curing process may be accomplished separately. Herein, the reinforcement layer 16 has a number of separate sections. Each separate section of the reinforcement layer 16 encapsulates a corresponding solder joint 24 and a corresponding first portion of the pillar 26 of each interconnect 22. The reinforcement layer 16 provides a clean surface for the reflowing process and provides superior reinforcement to each interconnect 22.

Figure 3E:
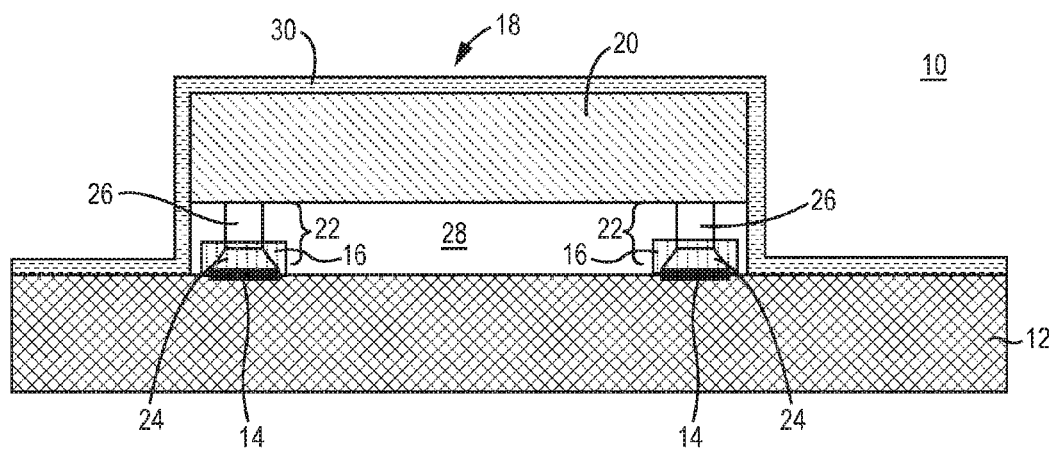

Finally, a protective layer 30 is formed over a top surface of the die body 20, down side surfaces of the die body 20, and toward the upper surface of the substrate 12 to define a perimeter of the air cavity 28 as depicted in FIG. 3E. In this exemplary process, none of the separate sections of the reinforcement layer 16 extends outside of the perimeter of the air cavity 28. The protective layer 30 extends directly to the upper surface of the substrate 12 and covers a portion of the upper surface of the substrate 12.

Those skilled in the art will recognize improvements and modifications to the embodiments of the present disclosure. All such improvements and modifications are considered within the scope of the concepts disclosed herein and the claims that follow.

What is claimed is:

1. An apparatus comprising:
   a substrate having an upper surface with a plurality of substrate I/O pads;
   a reinforcement layer over the upper surface of the substrate;
   a flip-chip die having a die body and a plurality of interconnects extending outward from a bottom surface of the die body, wherein each of the plurality of interconnects connects to a corresponding one of the plurality of substrate I/O pads through the reinforcement layer and at least one portion of the reinforcement layer encapsulates a first portion of each of the plurality of interconnects;
   an air cavity formed between the bottom surface of the die body and the upper surface of the substrate; and
   a protective layer extending over a top surface of the die body, down side surfaces of the die body, and toward the upper surface of the substrate to define a perimeter of the air cavity, wherein a second portion of each of the plurality of interconnects is exposed to the air cavity.

2. The apparatus of claim 1 wherein a thickness of the reinforcement layer is between 5 μm and 50 μm.

3. The apparatus of claim 1 wherein a height of each of the plurality of interconnects is between 20 μm and 125 μm.

4. The apparatus of claim 1 wherein each of the plurality of interconnects comprises a solder joint and a pillar extending outward from the bottom surface of the die body to the solder joint, wherein the solder joint is connected to the corresponding one of the plurality of substrate I/O pads.

5. The apparatus of claim 4 wherein a height of the solder joint is between 5 μm and 25 μm.

6. The apparatus of claim 4 wherein a height of the pillar is between 10 μm and 100 μm.

7. The apparatus of claim 4 wherein the solder joint of each of the plurality of interconnects is encapsulated by the at least one portion of the reinforcement layer.

8. The apparatus of claim 4 wherein a first portion of the pillar of each of the plurality of interconnects is encapsulated by the at least one portion of the reinforcement layer and a second portion of the pillar of each of the plurality of interconnects is exposed to the air cavity.

9. The apparatus of claim 8 wherein the first portion of the pillar encapsulated by the at least one portion of the reinforcement layer has a thickness of no more than 15 μm.

10. The apparatus of claim 8 wherein the second portion of the pillar exposed to the air cavity is between 60% and 80% of each of the plurality of interconnects.

11. The apparatus of claim 1 wherein the protective layer extends to the upper surface of the substrate and covers a portion of the upper surface of the substrate.

12. The apparatus of claim 1 wherein the protective layer extends to the reinforcement layer and covers a portion of the reinforcement layer.

13. The apparatus of claim 1 wherein the at least one portion of the reinforcement layer encapsulating the first portion of each of the plurality of interconnects is a contiguous section.

14. The apparatus of claim 13 wherein the contiguous section of the reinforcement layer extends along the upper surface of the substrate outside of the perimeter of the air cavity.

15. The apparatus of claim 13 wherein the contiguous section of the reinforcement layer does not extend outside of an area on the upper surface of the substrate that is underneath the die body.

16. The apparatus of claim 1 wherein the at least one portion of the reinforcement layer encapsulating the first portion of each of the plurality of interconnects includes a plurality of separate sections, wherein each of the plurality of separate sections encapsulates a corresponding first portion of each of the plurality of interconnects.

* * * * *